(12) United States Patent
Kaji (10) Patent No.: US 10,527,915 B2
(45) Date of Patent: Jan. 7, 2020

(54) LASER LIGHT SOURCE, PROJECTOR AND ILLUMINATION DEVICE USING SAME, AND BRIGHTNESS ADJUSTING METHOD

(71) Applicant: NEC Display Solutions, Ltd., Tokyo (JP)

(72) Inventor: Tomoyuki Kaji, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 0 days.

(21) Appl. No.: 16/071,879

(22) PCT Filed: Feb. 10, 2016

(86) PCT No.: PCT/JP2016/053945
§ 371 (c)(1),
(2) Date: Jul. 20, 2018

(87) PCT Pub. No.: WO2017/138111
PCT Pub. Date: Aug. 17, 2017

(65) Prior Publication Data
US 2019/0018310 A1    Jan. 17, 2019

(51) Int. Cl.
*G03B 21/20* (2006.01)
*G02B 27/10* (2006.01)
(Continued)

(52) U.S. Cl.
CPC ..... *G03B 21/2033* (2013.01); *G02B 27/1006* (2013.01); *G03B 21/2013* (2013.01);
(Continued)

(58) Field of Classification Search
CPC .... G03B 21/20; G03B 21/2033; G03B 33/06; G03B 21/2053; H04N 9/31; H04N 9/3194;
(Continued)

(56) References Cited

U.S. PATENT DOCUMENTS

2013/0271732 A1* 10/2013 Kuriaki ............... G03B 21/16
353/31

FOREIGN PATENT DOCUMENTS

JP    2008-131099 A    6/2008
JP    2012-215755 A    11/2012
(Continued)

OTHER PUBLICATIONS

Machine translation of JP2015-049266, Retrieved electronically from Japan Platform for Patent Information, Feb. 5, 2019.*

(Continued)

*Primary Examiner* — Cara E Rakowski
*Assistant Examiner* — Danell L Owens
(74) *Attorney, Agent, or Firm* — McGinn I.P. Law Group, PLLC.

(57) ABSTRACT

A laser light source includes; a plurality of laser devices that emit respectively different colors of laser light; a plurality of optical sensors that respectively detect the brightness of the plurality of colored lights; and a control unit that controls the brightness of each of the plurality of colored lights so that the detected values from the plurality of optical sensors become detection target values of brightness of the plurality of colored lights respectively corresponding to the brightness of synthesized light that is obtained by synthesizing the plurality of colored lights. If at least one of the detected values of the plurality of optical sensors cannot be controlled to be the detection target value, the control unit modifies all of the detection target values at the same proportion and controls the brightness of each of the plurality of colored lights to become the detection target values that were modified.

19 Claims, 5 Drawing Sheets

(51) Int. Cl.
    *H01S 5/40*      (2006.01)
    *H04N 9/31*      (2006.01)
    *G03B 33/06*     (2006.01)

(52) U.S. Cl.
    CPC ......... *G03B 21/2053* (2013.01); *G03B 33/06* (2013.01); *H01S 5/4087* (2013.01); *H04N 9/3161* (2013.01); *H04N 9/3164* (2013.01); *H04N 9/3194* (2013.01)

(58) Field of Classification Search
    CPC .... H04N 9/3164; H04N 9/3161; G02B 27/10; G02B 27/1006; H01S 5/40; H01S 5/4087
    See application file for complete search history.

(56) References Cited

FOREIGN PATENT DOCUMENTS

| | | |
|---|---|---|
| JP | 2013-222064 A | 10/2013 |
| JP | 2014-115310 A | 6/2014 |
| JP | 2015-049266 A | 3/2015 |
| JP | 2016-099768 A | 5/2015 |
| WO | WO 2014/030206 A1 | 2/2014 |

OTHER PUBLICATIONS

International Search Report (ISR) (PCT From PCT/ISA/210), in PCT/JP2016/053945, dated May 10, 2016.

\* cited by examiner

LASER LIGHT SOURCE, PROJECTOR AND ILLUMINATION DEVICE USING SAME, AND BRIGHTNESS ADJUSTING METHOD

TECHNICAL FIELD

The present invention relates to a light source device that includes a plurality of laser modules, a projector and an illumination device that use this light source device, and a brightness adjustment method.

BACKGROUND ART

Recently, as disclosed in Patent Document 1, light source devices, that are provided outside a projector or illumination device, are used as the light source of the projector or illumination device.

A configuration is typically adopted in which laser devices that each emit red, green and blue are provided in the light source devices, and the red, green, and blue laser light that is emitted by the laser devices is supplied by means of optical fibers.

LITERATURE OF THE PRIOR ART

Patent Documents

Patent Document 1: WO2014/030206 A1

DISCLOSURE OF THE INVENTION

Problem to be Solved by the Invention

In a light source device, the output of laser devices that emit each of red, green and blue is adjusted such that mixed-color light (synthesized light) of a predetermined tone is obtained at the time of shipment (at the time of initial operation).

The output of a laser device varies according to the environment of use and the time of use, and the state of variation differs for each individual laser device. As a result, the tone of the mixed-color light that is supplied as the light source device will vary.

The present invention realizes a laser light source that maintains the tone of mixed-color light that is supplied despite the occurrence of variation in the output of any of the laser devices that supply laser light of respectively different colors.

Means for Solving the Problem

The laser light source according to the present invention includes:

a plurality of laser devices that each emit laser light of respectively different colors;

a plurality of optical sensors that each detect the brightness of the plurality of colored lights; and a control unit that controls the brightness of each of the plurality of colored lights such that the detected values of the plurality of optical sensors become detection target values of the brightness of the plurality of colored lights that each correspond to the brightness of synthesized light in which the plurality of colored lights have been combined;

wherein, when at least one detected value of the plurality of optical sensors cannot be controlled to become the detection target value, the control unit modifies all of the detection target values at the same proportion and implements control of the brightness of each of the plurality of colored lights to become the detection target values that were modified.

The projector and illumination device according to the present invention are equipped with the above-described laser light source.

The brightness adjusting method according to the present invention is a brightness adjusting method that is carried out in a laser light source that is equipped with a plurality of laser devices that each emit laser light of respectively different colors; the brightness adjusting method including:

detecting the brightness of each of a plurality of colored lights by means of a plurality of optical sensors;

by means of a control unit, controlling the brightness of each of the plurality of colored lights such that the detected values of the plurality of optical sensors become the detection target values of the brightness of the plurality of colored lights that each correspond to the brightness of the synthesized light that results from combining the plurality of colored lights, and when at least one of the detected values of the plurality of optical sensors cannot be controlled to become the detection target value, modifying all of the detection target values at the same proportion and effecting control of the brightness of each of the plurality of colored lights to become the detection target values that were modified.

Effect of the Invention

According to the present invention, the tone of the mixed-color light that is supplied as output is maintained despite the occurrence of variation in any of the laser devices that supply laser light of respectively different colors.

EXAMPLE EMBODIMENTS

Example embodiments of the present invention are next described with reference to the accompanying drawings.

First Example Embodiment

Figure 1:
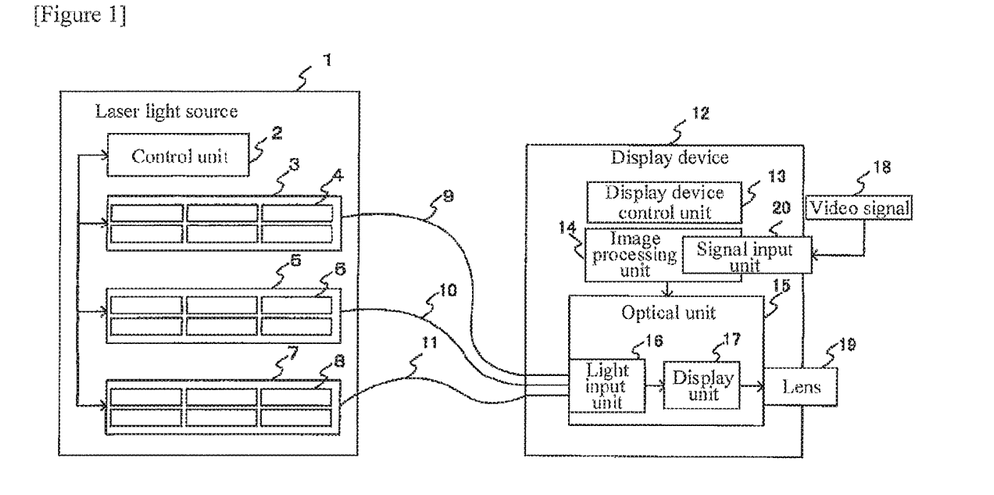
FIG. 1 is a block diagram that shows the configuration of an example embodiment of a projector system that uses the light source device according to the present invention.

FIG. 1 is a block diagram showing the configuration of an example embodiment of a projector system that uses a light source device according to the present invention.

FIG. 1 shows a configuration in which laser light source 1 that is a light source device according to the present invention is used as the light source of display device 12 that is a projector.

Laser light source 1 is provided with control unit 2 that controls the operation of laser light source 1, laser device 3 that generates red laser light, laser device 5 that generates green laser light, and laser device 7 that generates blue laser light. Laser devices 3, 5, and 7 are each provided with respective laser modules of a plurality of laser modules 4, 6, and 8. In the example shown in FIG. 1, each of laser devices 3, 5, and 7 is provided with respective laser modules of six laser modules 4, 6, and 8. Laser devices 3, 5, and 7 supply laser light of each color generated in the modules to optical fibers 9-11.

Display device 12 is made up of display device control unit 13, image processing unit 14, and optical unit 15. Display device control unit 13 controls the operation of each unit. Optical unit 15 is provided with light input unit 16 into which is applied red, blue and green laser light that is supplied from optical fibers 9-11, display unit 17 that is provided with a display element such as a DMD (Digital Micromirror Device) or LCD (Liquid Crystal Device) and that generates image light by means of the display element, and lens 19 that enlarges and projects to the outside the image light that was generated in display unit 17. Image processing unit 14 is provided with signal input unit 20 into which video signal 18 is applied as input, generates an image signal that has undergone a process that causes display unit 17 to generate the image indicated by video signal 18, and supplies this image signal to optical unit 15. In display unit 17, the display element is driven according to the image signal to generate the above-described image light.

Figure 2:
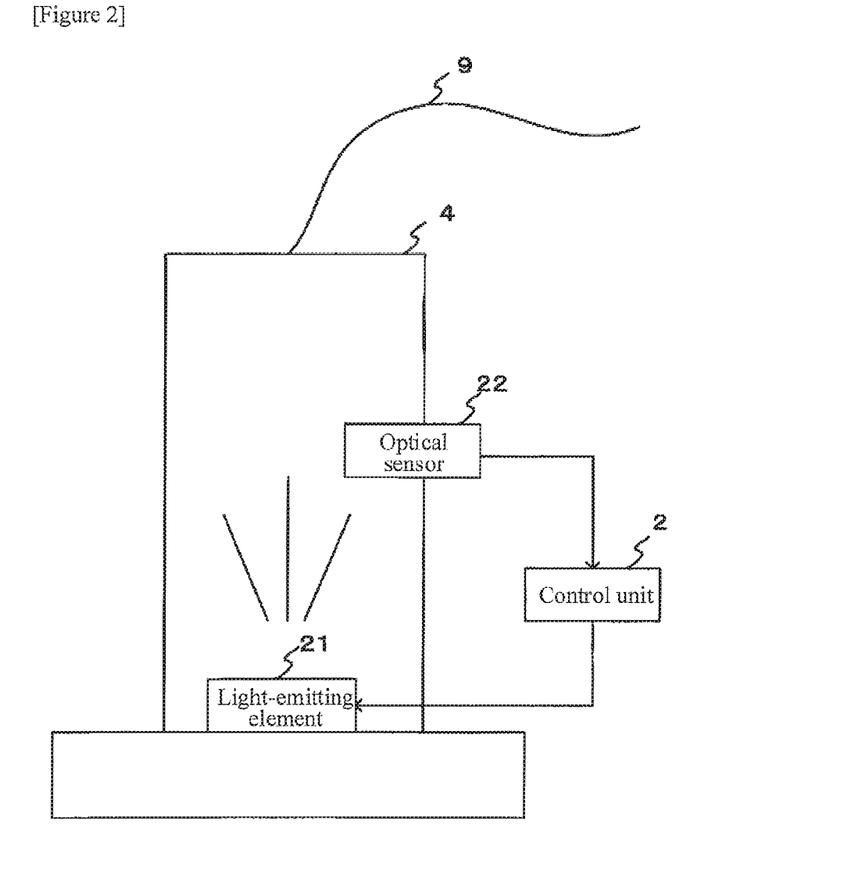
FIG. 2 shows the configuration of laser module 4 that is provided in laser device 3.

FIG. 2 shows the configuration of laser module 4 that is provided in laser device 3. All of laser modules 4, 6, and 8 that are provided in respective laser devices 3, 5, and 7 are provided with the same configuration as laser module 4 shown in FIG. 2.

Laser module 4 is provided with light-emitting elements 21 that emit red laser light and optical sensor 22 that detects the intensity of laser light that is generated by light-emitting elements 21. Laser module 6 is provided with light-emitting elements 21 that emit green laser light and optical sensor 22 that detects the intensity of laser light that is emitted by light-emitting elements 21. Laser module 8 is provided with light-emitting elements 21 that emit blue laser light and optical sensor 22 that detects the intensity of laser light that is generated by light-emitting elements 21. The detected value of optical sensor 22 is sent to control unit 2. Control unit 2 also receives the detected values of the other optical sensors 22 and controls the output of light-emitting elements 21 according to the detection results of each of the optical sensors.

Light-emitting element 21 emits laser light that changes in brightness according to supplied current value. Control unit 2 controls the current value that is supplied from the power source (not shown in the figure) to light-emitting element 21, but the maximum value of the supplied current range is stipulated by, for example, the specifications of the power source, and the minimum value is stipulated by, for example, the current value at which the light emission of the laser light stops.

Details regarding the control in control unit 2 are next described.

Control unit 2 is able to adjust the brightness that is supplied by each laser module by controlling the current that is applied to each laser module (light-emitting element), and as a result, is able to adjust the tone of the mixed-color light (synthesized light) that is obtained by red laser light, green (G) laser light, and blue (B) laser light supplied by laser light source 1.

In the following explanation, the detected value of optical sensors is assumed to be AA(xy) and the sum totals of the detected values of optical sensors of each color are assumed to be SUM(R), SUM(G), and SUM(B). Here, x indicates the color and y is assumed to be the serial number of the laser module in the laser device.

As shown in FIG. 1, when there are six laser modules in each laser device, SUM(R) of red laser device 3 is as shown below.

$$SUM(R)=AA(R1)+AA(R2)+AA(R3)+AA(R4)+AA(R5)+AA(R6)$$

The current that control unit 2 supplies to each of the laser modules is defined as POW. In order to supply light of a stabilized frequency, the minimum value and maximum value are determined for the current that is to be supplied to each laser module. In the following explanation, the minimum value of supplied current is defined as POW(min) and the maximum value is defined as POW(max). In addition, the minimum unit of supplied current that is controlled by control unit is defined as UNI. Here the units are A (amperes).

At the time of shipment of laser light source 1, the output of each laser device is adjusted such that the mixed-color light (the synthesized light in which the colors of light emitted by each laser device are combined) that is obtained by laser light source 1 is a predetermined tone, for example, white light, and moreover, the maximum brightness and the output balance (hereinbelow referred to as RGB balance) of the red laser light, green (G) laser light and blue (B) laser light are adjusted.

At the time of the above-described adjustment, control unit 2 of laser light source 1 finds the sum total (SUM(R), SUM(G), and SUM(B)) of the detected values of the optical sensors of each color and records this as TAR(R100), TAR(G100), and TAR(B100) that indicate the maximum value of the target value of the brightness of each color.

TAR(R100), TAR(G100), and TAR(B100) are examples of reference detection values.

The brightness at the time of adjustment is not limited to the maximum value and may be adjusted to become a predetermined brightness. In this case, control unit 2 of laser light source 1 finds the sum total (SUM(R), SUM(G), and SUM(B)) of the detection values of the optical sensors of each color and records this sum total as a value corresponding to a predetermined brightness.

Laser light source 1 is provided with an input unit (not shown in the figures) that receives instruction input for instructing the brightness. Although there are cases in which the instruction input that is applied to the input unit is directly entered by the device user, there are also cases such as in the example shown in FIG. 1 in which image processing unit 14 supplies a brightness instruction signal that accords with video signal 18 by way of, for example, a cable (not shown). Instruction input for instructing the brightness is, for example, instruction input that sets the brightness of the synthesized light in which the colors of light emitted by each laser device are combined to a predetermined brightness.

Control unit 2 adjusts the output of each laser device according to the instruction input to the input unit. For example, for instruction input that makes the brightness 70%, the following TAR(xy) are set as R, G and B. Here, "x" indicates the color, and "y" is the set brightness. Example: RGB target value when 70% is set:

R: (Value TAR(R100) that is recorded in the control unit)×0.7=TAR(R70)

G: (Value TAR(G100) that is recorded in the control unit)×0.7=TAR(G70)

B: (Value TAR(B100) that is recorded in the control unit)×0.7=TAR(B70)

TAR(R70), TAR(G70), and TAR(B70) are examples of detection target values.

Figure 3:
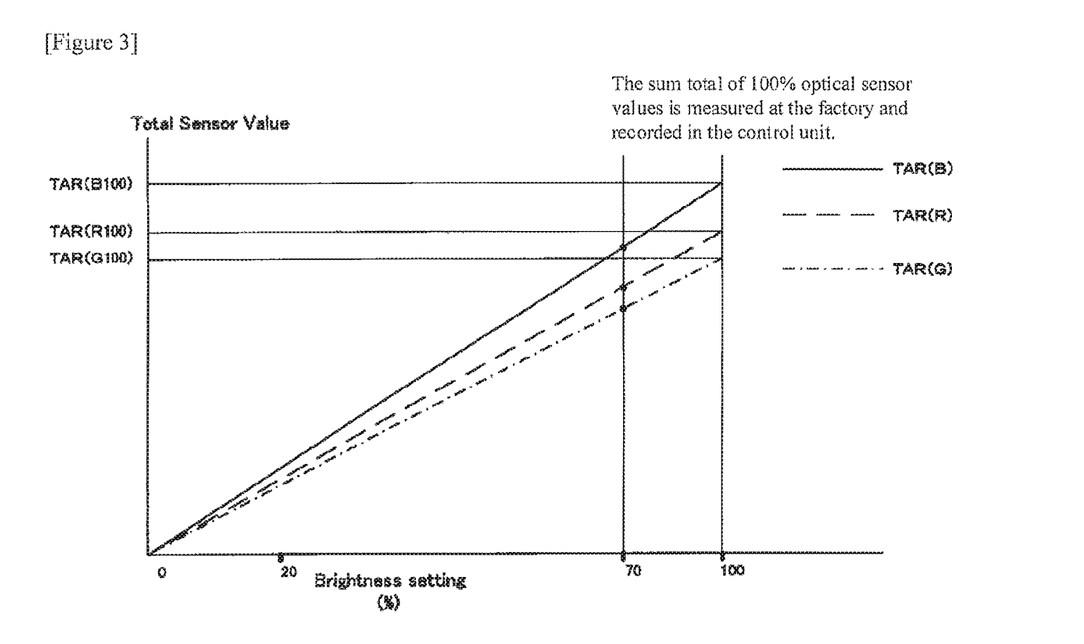
FIG. 3 shows the relation between the value of TAR (xy) and the value TAR (x100) that is recorded at the factory.

FIG. 3 shows the relation between the values of TAR(xy) and the values TAR(x100) that were recorded at the factory. The values of the lines of each TAR(100) at the time of 70% brightness are set as the target values.

The example that is explained using FIG. 3 shows the operation when the sum totals (SUM(R), SUM(G), and SUM(B)) of the detected values of the optical sensors of each color coincide with TAR(R100), TAR(G100), and TAR(B100) that were recorded in control unit 2. The output of each laser device changes according to the environment of use or the time of use, and when the brightness of the output light of each laser device differs from the time of shipment, the tone of the mixed-color light ends up different when the same values are added to each TAR(100). As a result, control as described hereinbelow is implemented in the present example embodiment.

Figure 4:
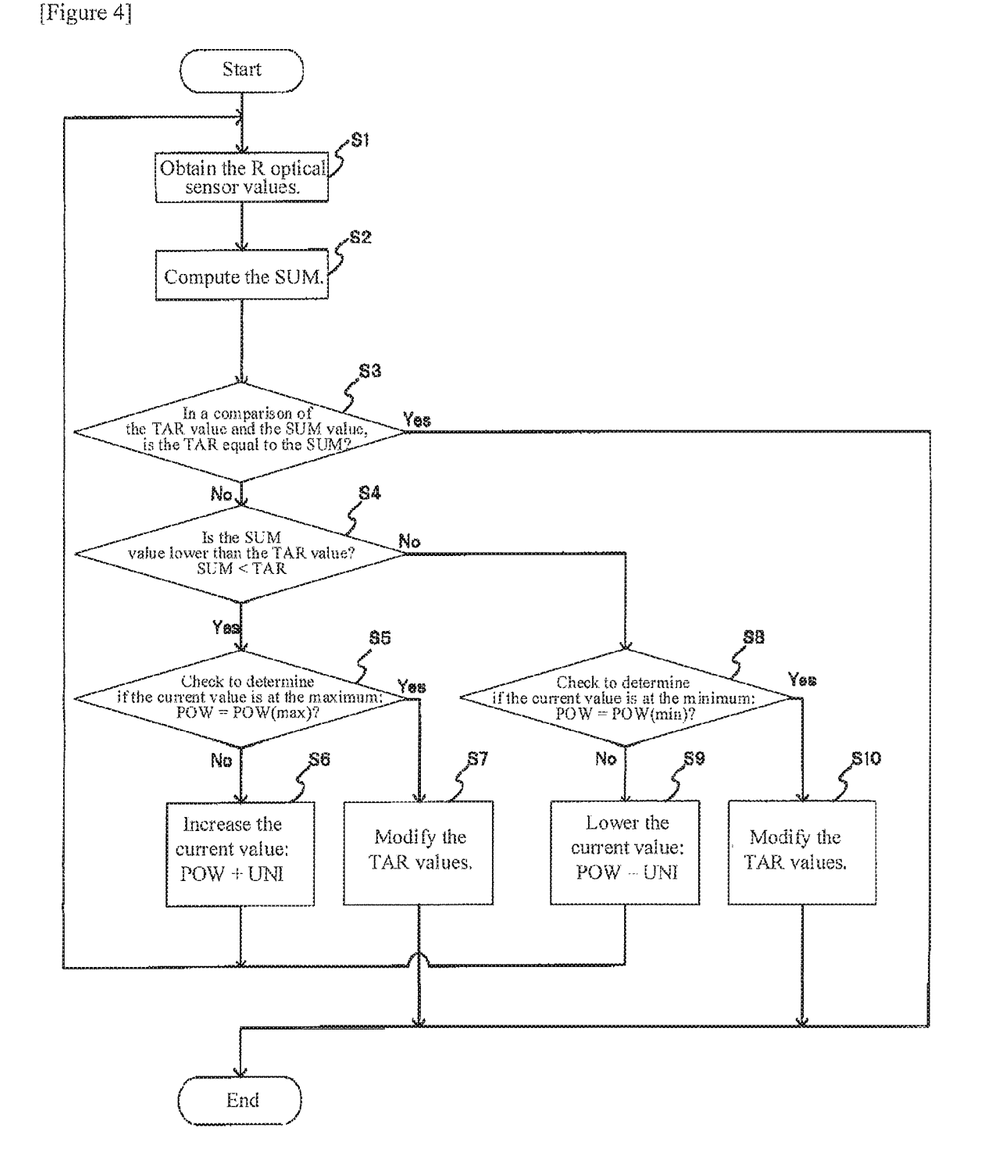
FIG. 4 is a flow chart showing the control operation that is carried out in control unit 2 of an example embodiment of the present invention.

FIG. 4 is a flow chart showing the control operation that is implemented in control unit 2 of the present example embodiment.

Control unit 2, upon receiving instruction input to set the brightness of the synthesized light to a predetermined brightness, finds the detection target values (TAR values) of the brightness of the light of each color that each correspond to the brightness of the synthesized light and, in accordance with the flow chart shown in FIG. 4, successively implements control one by one of the output value of each laser device. The example shown in FIG. 4 shows the control over the red (R) laser device, and the same control is subsequently repeatedly carried out in order for each of green (G) and blue (B).

Upon finding the target value (TAR value) of brightness, control unit 2 first finds the detected values of optical sensors 22 of the six laser modules that make up red laser device 3 (Step S1) and computes SUM(R)=AA(R1)+AA(R2)+AA(R3)+AA(R4)+AA(R5)+AA(R6) (Step S2).

Control unit 2 next checks whether the TAR value that was indicated in the instruction input matches the SUM(R) value that was computed in Step S2 (Step S3) and ends the process if these values match. As a result, the current value that was supplied to this point is maintained.

If control unit 2 finds that the TAR value does not match the SUM(R) value in Step S3, control unit 2 further checks whether the SUM(R) value is lower than the TAR value (Step S4). If control unit 2 finds that the SUM(R) value is lower than the TAR value, control unit 2 further checks whether the current values that are now being supplied to each laser module are all at maximum (Step S5), and if not at maximum, raises by the UNI amount the current values that are being supplied (Step S6) and returns to Step S1, and if at maximum, modifies the TAR value (Step S7) and ends the process.

When control unit 2 finds that the SUM(R) value is not lower than the TAR value in Step S4, control unit 2 further checks whether the current values now being supplied to each laser module are all at minimum (Step S8), and if not at minimum, lowers by the UNI amount the current values that are being supplied (Step S9) and returns to Step S1, and if at minimum, modifies the TAR value (Step S10) and ends the process.

The control described hereinabove is similarly carried out for green (G) and blue (B), and after adjustment has been carried out in the order of R, G, and B, the adjustment is restarted from R, and the RGB balance is thus constantly maintained by a loop process.

In other words, when at least one of the detected values of the optical sensors cannot be controlled to become the detection target value, the control unit modifies all of the detection target values at the same proportion and controls the brightness of the light of each color such that the detected values become the detection target values that were modified.

Figure 5A:
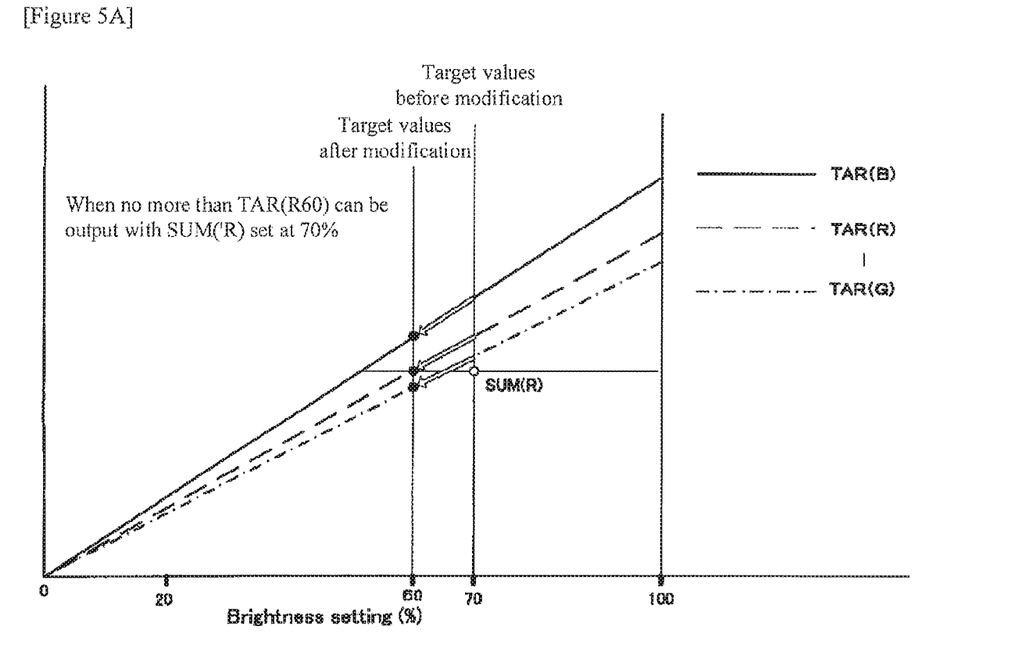
FIG. 5A shows the state of modifying the TAR value.

FIG. 5A shows the state in which the TAR value is made lower.

When the TAR value is 70% and the current SUM(R) value is output that is equivalent to TAR(R60), and moreover, when the supplied current value is at maximum, the TAR value is first modified to 60% in Step S7 in FIG. 4. Control in which the TAR value is 60% is subsequently carried out for green (G) and blue (B). When modifying the TAR values, change may be effected by lowering the value by a predetermined amount, such as 5%. In this case as well, the RGB balance is maintained by a loop process.

In other words, when the upper limit of the supplied current range that is supplied to a light-emitting element is exceeded, the control unit effects a modification to decrease the detection target value and controls the brightness of the colored light to become the detection target value after the modification.

Figure 5B:
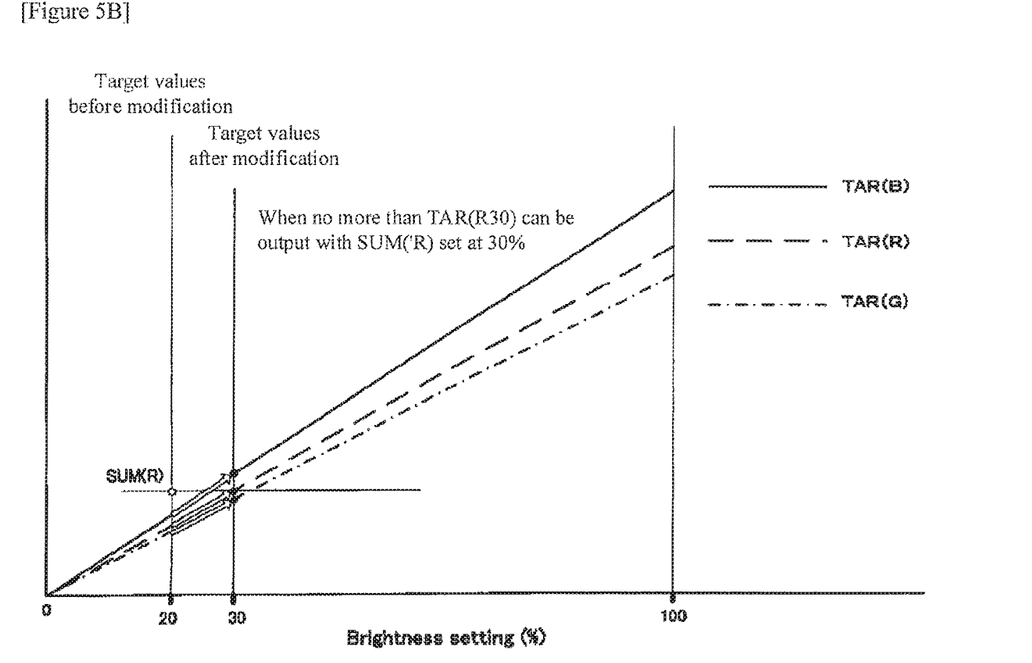
FIG. 5B shows the state of modifying the TAR value.

FIG. 5B shows the state in which the TAR value is made higher.

When the TAR value is 20%, the current SUM(R) value is output that is equivalent to TAR(R30), and moreover, when the supplied current value is at minimum, the TAR value is first modified to 30% in Step S10 in FIG. 4. Control in which the TAR value is 30% is subsequently carried out for green (G) and blue (B). In some cases, light-emitting element 21 no longer emits light when the current value falls below a predetermined value. A current value that is greater than the current value at which light-emitting element 21 no longer emits light is therefore preferably set as the minimum value. When the TAR values are modified, changes may be made to raise by a predetermined value amount such as 5%. In this case as well, the RGB balance is maintained by a loop process.

In other words, when the current that is supplied to a light-emitting element falls below the lower limit of the current supply range, the control unit makes a modification to increase the detection target values and controls the brightness of colored light to become the detection target values that follows the modification.

In the present example embodiment that is configured as described hereinabove, even should change occur in brightness as a result of deterioration with the passage of years or the ambient temperature in any of the laser devices of each color, brightness targets are given to each laser device that are within the range that can be supplied as output, and moreover, that have the same values, and the tone of the mixed-colored light can thus be uniformly maintained.

Second Example Embodiment

Figure 6:
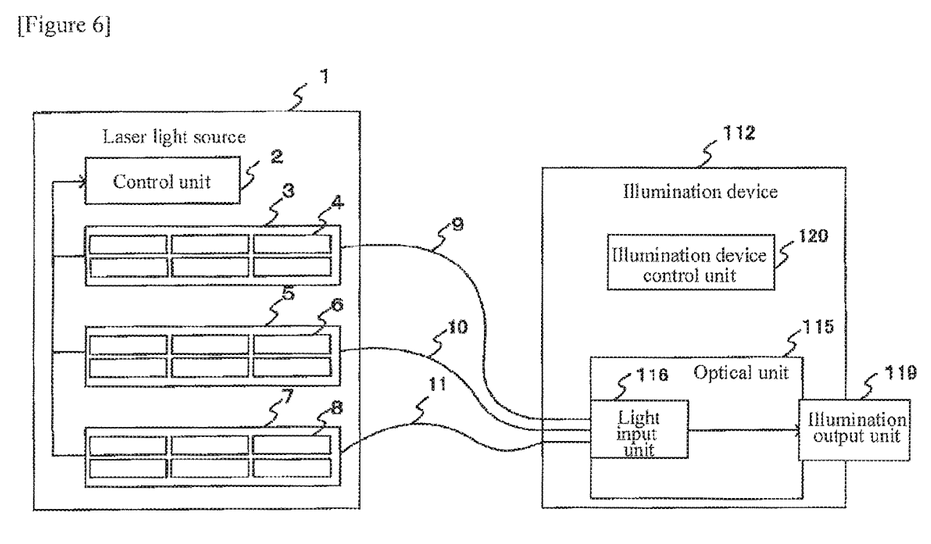
FIG. 6 is a block diagram showing the configuration of an example embodiment of an illumination system that uses the light source device according to the present invention.

FIG. 6 is a block diagram showing the configuration of an example embodiment of an illumination system that uses the light source device according to the present invention. The present example embodiment is made up of laser light source 1 shown in FIG. 1 and illumination device 112. Illumination device 112 is provided with illumination device control unit 120 and optical unit 115 that is provided with light input unit 116 and illumination output unit 119. Light input unit 116 receives each laser beam from laser light source 1 that is transmitted in via optical fibers 9-11, mixes these light beams, and supplies the result as mixed-color light. Illumination output unit 119 projects the mixed-color light that was mixed in light input unit 116 as illumination light. Illumination device control unit 120 controls the brightness and projection state of the illumination light that is projected.

In the present example embodiment that is configured as described above, as with the first example embodiment, the tone of mixed-color light that is projected is uniformly maintained.

Although explanation in the above-described example embodiments regards a configuration in which each of the laser devices is made up of a plurality of laser modules and optical sensors are provided in each of the laser modules, this is a configuration principally directed to increasing the intensity of output light. The laser device may of course also be made up of a single laser module.

In addition, although explanation was made about a configuration in which a plurality of laser devices emit red laser light, green laser light, and blue laser light, the plurality of laser devices may be two laser devices that emit red and green light, and the red and green are combined to produce yellow and are adjusted to become a predetermined shade of yellow. Still further, apart from combinations of green and blue and of blue and red, two or more of, for example, yellow, magenta, and cyan may also be combined.

In each of the example embodiments described hereinabove, the configurations shown in the drawings are merely examples, and the present invention is not limited to these configurations.

All or a portion of the above-described example embodiments may also be described as shown below but are not limited to the following configurations.

[Supplementary Note 1]

A laser light source comprises:

a plurality of laser devices that each emit laser light of respectively different colors;

a plurality of optical sensors that each detect the brightness of the plurality of colored lights; and a control unit that controls the brightness of each of the plurality of colored lights such that the detected values of the plurality of optical sensors become detection target values of the brightness of the plurality of colored lights that each correspond to the brightness of synthesized light in which said plurality of colored lights have been combined;

wherein, if at least one detected value of the plurality of optical sensors cannot be controlled to become the detection target value, the control unit modifies all of the detection target values at the same proportion and implements control of the brightness of each of the plurality of colored lights to become the detection target values that were modified.

[Supplementary Note 2]

In the laser light source as described in Supplementary Note 1:

the laser devices each include a light-emitting element that emits laser light; and when an upper limit of a range of supplied current that is supplied to the light-emitting element is exceeded, the control unit modifies the detection target value so that the detection target value is decreased and implements control to make the brightness of the colored light become the modified detection target value.

[Supplementary Note 3]

In the laser light source as described in Supplementary Notes 1 and 2:

the laser devices each include a light-emitting element that emits laser light; and when a lower limit of the range of supplied current that is supplied to the light-emitting element is exceeded, the control unit modifies the detection target value so that the detection target value is increased and implements control to make the brightness of the colored light become the modified detection target value.

[Supplementary Note 4]

In the laser light source as described in any one of Supplementary Notes 1 to 3:

upon receiving instruction to make the brightness of the synthesized light a predetermined brightness, the control unit finds each of the detection target values on the basis of a predetermined brightness that was received and each of reference detection values that were set in advance for each of the plurality of laser devices.

[Supplementary Note 5]

In the laser light source as described in Supplementary Note 4:

the reference detection values are each of the detected values that were detected by the plurality of optical sensors when the color of the synthesized light is a predetermined color.

[Supplementary Note 6]

In the laser light source as described in Supplementary Note 5, the predetermined color is white.

[Supplementary Note 7]

In the laser light source as described in any one of Supplementary Notes 1 to 6: the plurality of laser devices respectively emit red laser light, green laser light, and blue laser light.

[Supplementary Note 8]

In the laser light source as described in any one of Supplementary Notes 1 to 7:

each of the plurality of laser devices is made up of a plurality of laser modules, the optical sensors provided corresponding to each laser device are provided corresponding to each laser module; and the detected values of each laser device are added values of the plurality of optical sensors provided corresponding to each laser module.

[Supplementary Note 9]

A projector is provided with the laser light source described in any one of Supplementary Notes 1 to 8.

[Supplementary Note 10]

An illumination device is provided with the laser light source described in any one of Supplementary Notes 1 to 8.

[Supplementary Note 11]

A brightness adjusting method that is carried out in a laser light source that is equipped with a plurality of laser devices that each emit laser light of respectively different colors includes:

detecting the brightness of each of the plurality of colored lights by means of a plurality of optical sensors;

by means of a control unit, controlling the brightness of each of the plurality of colored lights such that the detected values of the plurality of optical sensors become the detection target values of the brightness of the plurality of colored lights that each correspond to the brightness of the synthesized light that results from combining the plurality of colored lights, and if at least one of the detected values of the plurality of optical sensors cannot be controlled to become the detection target value, modifying all of the detection target values at the same proportion and effecting control of the brightness of each of the plurality of colored lights to become the detection target values that were modified.

EXPLANATION OF REFERENCE NUMBERS 1 laser light source
2 control unit
3, 5, 7 laser device
4, 6, 8 laser module
21 light-emitting element
22 optical sensor

The invention claimed is:

1. A laser light source, comprising:
a plurality of laser devices that each emit laser light of respectively different colors;
a plurality of optical sensors that each detect brightness of a plurality of colored lights that are emitted from said plurality of laser devices; and
a control unit that controls the brightness of each of said plurality of colored lights such that detected values of said plurality of optical sensors become detection target values of the brightness of the plurality of colored lights that each correspond to brightness of synthesized light in which said plurality of colored lights have been combined,
wherein, when at least one detected value of said plurality of optical sensors cannot be controlled to become said detection target value, said control unit modifies all of said detection target values at a same proportion and implements control of the brightness of each of said plurality of colored lights to become the detection target values that were modified,
wherein said laser devices each include a light-emitting element that emits the laser light, and
wherein, when a supplied current that is supplied to said light-emitting element falls below a lower limit of a rangy e of supplied current that is supplied to said light-emitting element, said control unit modifies said detection target value such that said detection target value is increased and implements control, to make the brightness of said colored light become a modified detection target value of the detection target values that were modified.

2. The laser light source as set forth in claim 1, wherein, when the supplied current that is supplied to said light-emitting element exceeds an upper limit of the range of supplied current that is supplied to said light-emitting, said control unit modifies said detection target value so that said detection target value is decreased and implements control to make the brightness of said colored light become the modified detection target value.

3. The laser light source as set forth in claim 2, wherein the upper limit of the range of supplied current is determined by a power source provided to the light-emitting element.

4. The laser light source as set forth in claim 1, wherein, upon receiving instruction to make the brightness of said synthesized light a predetermined brightness, said control unit finds each of said detection target values on a basis of a predetermined brightness that was received and each of reference detection values that were set in advance for each of said plurality of laser devices.

5. The laser light source as set forth in claim 4, wherein said reference detection values comprise each of the detected values that were detected by the plurality of said optical sensors when the color of said synthesized light comprises a predetermined color.

6. The laser light source as set forth in claim 5, wherein said predetermined color includes white.

7. The laser light source as set forth in claim 1, wherein said plurality of laser devices respectively emit red laser light, green laser light, and blue laser light.

8. The laser light source as set forth in claim 1, wherein each of said plurality of laser devices comprises a plurality of laser modules, said optical sensors provided corresponding to each laser device are provided corresponding to each laser module, and
wherein the detected values of each laser device are added values of the plurality of optical sensors provided corresponding to each laser module.

9. A projector comprising a laser light source as set forth in claim 1.

10. An illumination device comprising a laser light source as set forth in claim 1.

11. The laser light source as set forth in claim 1, wherein a current value, which is greater than a current value at which said light-emitting element no longer emits light, is set as the lower limit of the range of supplied current.

12. The laser light source as set forth in claim 1, wherein said control unit modifies said detection target value by changing said detection target value with a predetermined value amount.

13. A brightness adjusting method that is carried out in a laser light source that includes a plurality of laser devices that each emit laser light of respectively different colors, said brightness adjusting method comprising:
detecting, by a plurality of optical sensors, a brightness of each of a plurality of colored lights that are emitted from said plurality of laser devices;
by a control unit, controlling the brightness of each of said plurality of colored lights such that detected values of said plurality of optical sensors become the detection target values of the brightness of said plurality of colored lights that each correspond to brightness of synthesized light that results from combining said plurality of colored lights, and when at least one of the detected values of said plurality of optical sensors cannot be controlled to become said detection target value, modifying all of said detection target values at a same proportion and effecting control of the brightness of each of said plurality of colored lights to become the detection target values that were modified,
wherein said laser devices each include a light-emitting element that emits the laser light, and
wherein, when a supplied current that is supplied to said light-emitting element falls below a lower limit of a range of supplied current that is supplied to said light-emitting element, said control unit modifies said detection target value such that said detection target value is increased and implements control to make the brightness of said colored fight become a modified detection target value of the detection target values that were modified.

14. The brightness adjusting method as set forth in claim 13, wherein a current value, which is greater than a current value at which said light-emitting element no longer emits light, is set as the lower limit of the range of supplied current.

15. The brightness adjusting method as set forth in claim 13, wherein said control unit modifies said detection target value by changing said detection target value with a predetermined value amount.

16. The brightness adjusting method as set forth in claim 13, wherein, when the supplied current, which is supplied to said light-emitting element, exceeds an upper limit of the range of supplied current that is supplied to said light-emitting element, said control unit modifies said detection target value so that said detection target value is decreased and implements control to make the brightness of said colored light become the modified detection target value.

17. The brightness adjusting method as set forth in claim 16, wherein the upper limit of the range of supplied current is determined by a power source provided to the light-emitting element.

18. The brightness adjusting method as set forth in claim 13, wherein, upon receiving instruction to make the brightness of said synthesized light a predetermined brightness, said control unit finds each of said detection target values on a basis of a predetermined brightness that was received and each of reference detection values that were set in advance for each of said plurality of laser devices.

19. The brightness adjusting method as set forth in claim 13, wherein said reference detection values comprise each of the detected values that were detected by the plurality of said optical sensors when the color of said synthesized light comprises a predetermined color.

\* \* \* \* \*